United States Patent
Kalutarage et al.

(10) Patent No.: US 12,084,764 B2
(45) Date of Patent: *Sep. 10, 2024

(54) VAPOR PHASE PHOTORESISTS DEPOSITION

(71) Applicant: Applied Materials, Inc., Santa Clara, CA (US)

(72) Inventors: Lakmal Charidu Kalutarage, San Jose, CA (US); Aaron Dangerfield, Santa Clara, CA (US); Mark Joseph Saly, Milpitas, CA (US); David Michael Thompson, San Jose, CA (US); Susmit Singha Roy, Sunnyvale, CA (US); Regina Freed, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/351,096

(22) Filed: Jun. 17, 2021

(65) Prior Publication Data

US 2022/0002869 A1 Jan. 6, 2022

Related U.S. Application Data

(60) Provisional application No. 63/047,162, filed on Jul. 1, 2020.

(51) Int. Cl.
*C23C 16/455* (2006.01)
*G03F 7/16* (2006.01)

(52) U.S. Cl.
CPC ........ *C23C 16/45538* (2013.01); *G03F 7/167* (2013.01); *C23C 16/45527* (2013.01); *C23C 16/45529* (2013.01)

(58) Field of Classification Search
CPC .............. C23C 16/45538; C23C 16/40; C23C 16/45536; C23C 16/45527;
(Continued)

(56) References Cited

U.S. PATENT DOCUMENTS 9,343,297 B1 * 5/2016 Fukazawa ......... H01L 21/02126
2006/0257563 A1 * 11/2006 Doh .................. C23C 16/45531
427/248.1

(Continued)

FOREIGN PATENT DOCUMENTS

JP 2019500490 A 1/2019
JP 202084330 A 6/2020
(Continued)

OTHER PUBLICATIONS

International Search Report and Written Opinion from PCT/US2021/038978 dated Oct. 21, 2021, 9 pgs.
(Continued)

*Primary Examiner* — Gordon Baldwin
*Assistant Examiner* — Christina D McClure
(74) *Attorney, Agent, or Firm* — Schwabe, Williamson & Wyatt, P.C.

(57) ABSTRACT

Embodiments disclosed herein include methods of depositing a metal oxo photoresist using dry deposition processes. In an embodiment, the method for forming a photoresist layer over a substrate in a vacuum chamber comprises providing a metal precursor vapor into the vacuum chamber. In an embodiment, the method further comprises providing an oxidant vapor into the vacuum chamber, where a reaction between the metal precursor vapor and the oxidant vapor results in the formation of the photoresist layer on a surface of the substrate. In an embodiment, the photoresist layer is a metal oxo containing material.

14 Claims, 6 Drawing Sheets

(58) Field of Classification Search
CPC . C23C 16/45529; G03F 7/167; G03F 7/0042; G03F 7/0043; G03F 7/168
See application file for complete search history.

(56) References Cited

U.S. PATENT DOCUMENTS

| | | | | |
|---|---|---|---|---|
| 2014/0120738 A1* | 5/2014 | Jung | ................ | C23C 16/45536 438/778 |
| 2017/0102612 A1* | 4/2017 | Meyers | ................ | C23C 14/086 |
| 2017/0146909 A1 | 5/2017 | Smith et al. | | |
| 2017/0323775 A1* | 11/2017 | Saly | .................... | H01L 21/0228 |
| 2018/0307137 A1 | 10/2018 | Meyers et al. | | |
| 2019/0163056 A1 | 5/2019 | Maes et al. | | |
| 2020/0133131 A1 | 4/2020 | Ouyang | | |
| 2020/0176246 A1* | 6/2020 | Huotari | ............. | H01L 21/02348 |
| 2022/0026807 A1* | 1/2022 | Kalutarage | ....... | C23C 16/45553 |
| 2022/0199406 A1* | 6/2022 | Kalutarage | ........... | G03F 7/0044 |
| 2022/0262625 A1* | 8/2022 | Kalutarage | ......... | H01L 21/0274 |
| 2022/0308453 A1* | 9/2022 | Kalutarage | ....... | H01J 37/32449 |

FOREIGN PATENT DOCUMENTS

| | | |
|---|---|---|
| TW | 2012-24190 | 6/2012 |
| TW | 2015-06198 | 2/2015 |
| TW | 2016-38376 | 11/2016 |
| TW | 2017-34025 | 10/2017 |
| TW | 2020-22493 | 6/2020 |
| WO | WO 2018-200288 | 11/2018 |
| WO | 2019217749 A1 | 11/2019 |

OTHER PUBLICATIONS

International Preliminary Report on Patentability from PCT/US2021/038978 dated Jan. 12, 2023, 6 pgs.

Official Letter from Taiwan Patent Application No. 110123687 dated May 25, 2023, 16 pgs.

Notice of Reasons for Rejection from Japanese Patent Application No. 2022-581342 dated Feb. 14, 2024, 8 pgs.

Notice of Reasons for Rejection from Japanese Patent Application No. 2022-581342 dated Jun. 11, 2024, 5 pgs.

* cited by examiner

R=alkyl

VAPOR PHASE PHOTORESISTS DEPOSITION

CROSS-REFERENCE TO RELATED APPLICATIONS

This application claims the benefit of U.S. Provisional Application No. 63/047,162, filed on Jul. 1, 2020, the entire contents of which are hereby incorporated by reference herein.

BACKGROUND

1) Field

Embodiments of the present disclosure pertain to the field of semiconductor processing and, in particular, to methods of depositing a photoresist layer onto a substrate using vapor phase processes.

2) Description of Related Art

Lithography has been used in the semiconductor industry for decades for creating 2D and 3D patterns in microelectronic devices. The lithography process involves spin-on deposition of a film (photoresist), irradiation of the film with a selected pattern by an energy source (exposure), and removal (etch) of exposed (positive tone) or non-exposed (negative tone) region of the film by dissolving in a solvent. A bake will be carried out to drive off remaining solvent.

The photoresist should be a radiation sensitive material and upon irradiation a chemical transformation occurs in the exposed part of the film which enables a change in solubility between exposed and non-exposed regions. Using this solubility change, either exposed or non-exposed regions of the photoresist is removed (etched). Now the photoresist is developed and the pattern can be transferred to the underlying thin film or substrate by etching. After the pattern is transferred, the residual photoresist is removed and repeating this process many times can give 2D and 3D structures to be used in microelectronic devices.

Several properties are important in lithography processes. Such important properties include sensitivity, resolution, lower line-edge roughness (LER), etch resistance, and ability to form thinner layers. When the sensitivity is higher, the energy required to change the solubility of the as-deposited film is lower. This enables higher efficiency in the lithographic process. Resolution and LER determine how narrow features can be achieved by the lithographic process. Higher etch resistant materials are required for pattern transferring to form deep structures. Higher etch resistant materials also enable thinner films. Thinner films increase the efficiency of the lithographic process.

SUMMARY

Embodiments disclosed herein include methods of depositing a metal oxo photoresist using dry deposition processes. In an embodiment, the method for forming a photoresist layer over a substrate in a vacuum chamber comprises providing a metal precursor vapor into the vacuum chamber. In an embodiment, the method further comprises providing an oxidant vapor into the vacuum chamber, where a reaction between the metal precursor vapor and the oxidant vapor results in the formation of the photoresist layer on a surface of the substrate. In an embodiment, the photoresist layer is a metal oxo containing material.

In an additional embodiment, a method of forming a photoresist layer over a substrate in a vacuum chamber comprises initiating a deposition cycle. In an embodiment, the deposition cycle comprises providing a metal precursor vapor into the vacuum chamber, where the metal precursor vapor absorbs to a surface over the substrate, and purging the vacuum chamber. In an embodiment, the deposition cycle further comprises providing an oxidant vapor into the vacuum chamber, where a reaction between the metal precursor absorbed to the surface over the substrate and the oxidant vapor results in the formation of the photoresist layer over the surface of the substrate. In an embodiment, the photoresist layer is a metal oxo containing material. In an embodiment, the deposition cycle further comprises purging the vacuum chamber.

In an additional embodiment, a method of forming a photoresist layer over a substrate in a vacuum chamber comprises providing a metal precursor vapor into the vacuum chamber. In an embodiment, the metal precursor comprises TDMASn. In an embodiment, the method further comprises providing an oxidant vapor into the vacuum chamber. In an embodiment, the oxidant vapor comprises ethylene glycol. In an embodiment, a reaction between the metal precursor vapor and the oxidant vapor results in the formation of the photoresist layer on a surface of the substrate. In an embodiment, the photoresist layer comprises SnOC.

DETAILED DESCRIPTION

Figure 1:
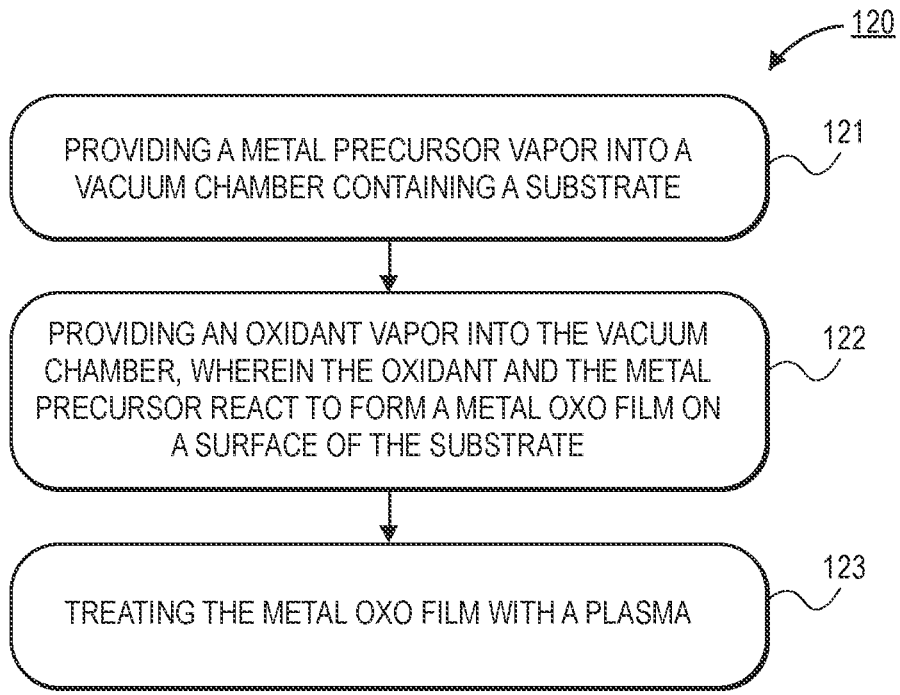
FIG. 1 is a flowchart illustrating a process for forming a photoresist on a substrate using a vacuum deposition process, in accordance with an embodiment of the present disclosure.

Methods of depositing a photoresist on a substrate using vapor phase processes are described herein. In the following description, numerous specific details are set forth, such as chemical vapor deposition (CVD) and atomic layer deposition (ALD) processes and material regimes for depositing a photoresist, in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

To provide context, photoresist systems used in extreme ultraviolet (EUV) lithography suffer from low efficiency. That is, existing photoresist material systems for EUV lithography require high dosages in order to provide the needed solubility switch that allows for developing the photoresist material. Organic-inorganic hybrid materials (e.g., metal oxo materials systems) have been proposed as a material system for EUV lithography due to the increased sensitivity to EUV radiation. Such material systems typically comprise a metal (e.g., Sn, Hf, Zr, etc.), oxygen, and carbon. Metal oxo based organic-inorganic hybrid materials have also been shown to provide lower LER and higher resolution, which are required characteristics for forming narrow features.

Metal oxo material systems are currently disposed over a substrate using a wet process. The metal oxo material system is dissolved in a solvent and distributed over the substrate (e.g., a wafer) using wet chemistry deposition processes, such as a spin coating process. Wet chemistry deposition of the photoresist suffers from several drawbacks. One negative aspect of wet chemistry deposition is that a large amount of wet byproducts are generated. Wet byproducts are not desirable and the semiconductor industry is actively working to reduce wet byproducts wherever possible. Additionally, wet chemistry deposition may result in non-uniformity issues. For example, spin-on deposition may provide a photoresist layer that has a non-uniform thickness or non-uniform distribution of the metal oxo molecules. Additionally, it has been shown that metal oxo photoresist material systems suffer from thickness reduction after exposure, which is troublesome in lithographic processes. Furthermore, in a spin-on process, the percentage of metal in the photoresist is fixed, and cannot be easily tuned.

Accordingly, embodiments of the present disclosure provide a vacuum deposition process for providing a metal oxo photoresist layer. The vacuum deposition process addresses the shortcomings of the wet deposition process described above. Particularly, a vacuum deposition process provides the advantages of: 1) eliminating the generation of wet byproducts; 2) providing a highly uniform photoresist layer; 3) resisting thickness reduction after exposure; and 4) providing a mechanism to tune the percentage of metal in the photoresist.

Embodiments disclosed herein provide various vacuum deposition processes that comprise the reaction of a metal precursor with an oxidant. In a first embodiment, the vacuum deposition process may be a chemical vapor deposition (CVD) process. In a second embodiment, the vacuum deposition process may be an atomic layer deposition (ALD) process. The vacuum deposition process may be a thermal process in some embodiments. In other embodiments, the vacuum deposition process may be a plasma enhanced (PE) deposition process (e.g., PE-CVD or PE-ALD).

In an embodiment, the vacuum deposition process relies on chemical reactions between a metal precursor and an oxidant. The metal precursor and the oxidant are vaporized to a vacuum chamber. The metal precursor reacts with the oxidant to form a photoresist layer comprising a metal oxo on the surface of a substrate. In some embodiments, the metal precursor and the oxidant are provided to the vacuum chamber together. In other embodiments, the metal precursor and the oxidant are provided to the vacuum chamber with alternating pulses. In an ALD or PE-ALD process, a purge of the vacuum chamber may be provided between pulses of the metal precursor and the oxidant.

Referring now to FIG. 1, a flowchart illustrating a process 120 for depositing a metal oxo photoresist on a substrate surface is provided, in accordance with an embodiment of the present disclosure. The process 120 may be described as a CVD or a PE-CVD process. In a CVD process, the chemical reactions are driven thermally, whereas in a PE-CVD process the chemical reactions may be enhanced by the presence of a plasma. In PE-CVD processes a hydrocarbon may also be flown into the chamber during plasma assisted deposition to incorporate more carbon into the film. When the plasma is on during the deposition, and if there are hydrocarbon molecules in the chamber, it may add more carbon to the film. A form of carbon could be M-C (M=metal). M-C (e.g., Sn—C) can be sensitive to exposure. A hydrocarbon can be a carbon containing molecule, such as, for example, $CH_2=CH_2$, acetylene, $CH_4$, propylene, etc.

Figure 2A:
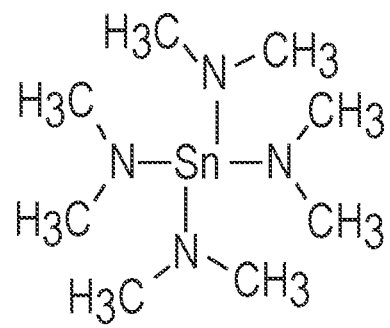
FIGS. 2A-2C are exemplary metal precursors that may be used in the process described in the flowchart of FIG. 1, in accordance with an embodiment of the present disclosure.
Figure 2B:
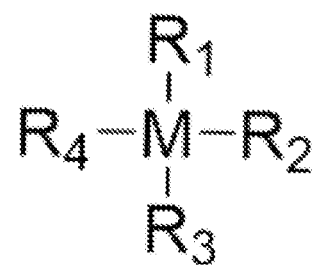
Figure 2C:
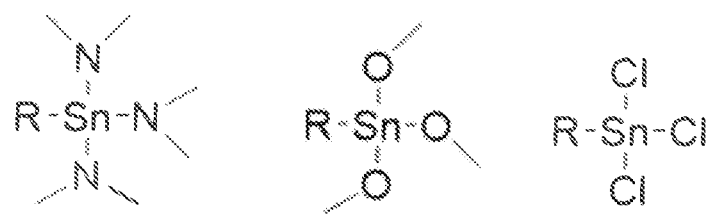
Figure 2C:
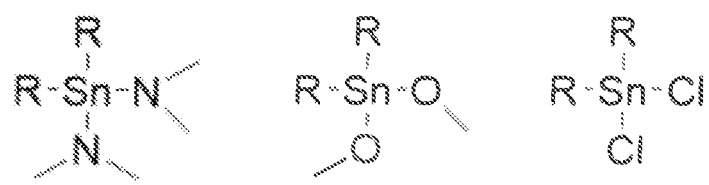

In an embodiment, process 120 may begin with operation 121 which comprises providing a metal precursor vapor into a vacuum chamber containing a substrate. In an embodiment, the metal precursor vapor may comprise a molecule with one or more metal atoms. An example of a suitable metal precursor 210 is provided in FIG. 2A. The precursor 210 in FIG. 2A is tetrakis(dimethylamino)tin(IV) (TDMASn). However, it is to be appreciated that other metal precursors may also be used to provide a metal oxo with a different metal atom. For example, the one or more metal atoms of the metal precursor vapor may comprise one or more of Sn, Hf, Zr, Co, Cr, Mn, Fe, Cu, Ni, Mo, W, Ta, Os, Re, Pd, Pt, Ti, V, In, Sb, Al, As, Ge, Se, Cd, Ag, Pb, Au, Er, Yb, Pr, La, Na, and Mg. Generally, the precursor 210 may have the formula shown in FIG. 2B, where M is a metal, and $R_{1-4}$ are ligands. The ligands may comprise one or more of alkyl, alkenyl, alkynyl, aryl, benzyl, $NR_2$, halide, Cp (cyclopentadienyl), alkoxy, imide, phosphene, phosphite, isocyanate, isothiocyanate, cyanate, thiocyanate, borane, and borane amine ligands. In some embodiments, one ligand may have more than one donor atom, and the donor atoms can be different from each other (e.g., ligands with O and N donor atoms). Examples of ligands with more than one donor atom may include, but are not limited to, carboxylate, acetonate, amidate, amidinate, pyrazolate, carbohydrazide. These precursors may have mixed ligands. Generic examples of some suitable precursors are shown in FIG. 2C, where R is an alkyl. In an embodiment, the metal precursor vapor may be diluted by a carrier gas. The carrier gas may be an inert gas such as, Ar, $N_2$, or He.

Additionally, it is to be appreciated that more than one metal precursor vapor may be provided into the vacuum chamber. For example, a first metal precursor may comprise Sn and a second metal precursor may comprise Hf. In such embodiments, the resulting metal oxo photoresist may comprise two or more different types of metal atoms.

In an embodiment, process 120 may continue with operation 122 which comprises providing an oxidant vapor into the vacuum chamber. In an embodiment, the oxidant vapor may comprise a carbon backbone with reactive groups on opposing ends of the carbon backbone. The reactive groups initiate the reaction with the metal precursor that results in the formation of a metal oxo photoresist on the substrate.

Figure 3:
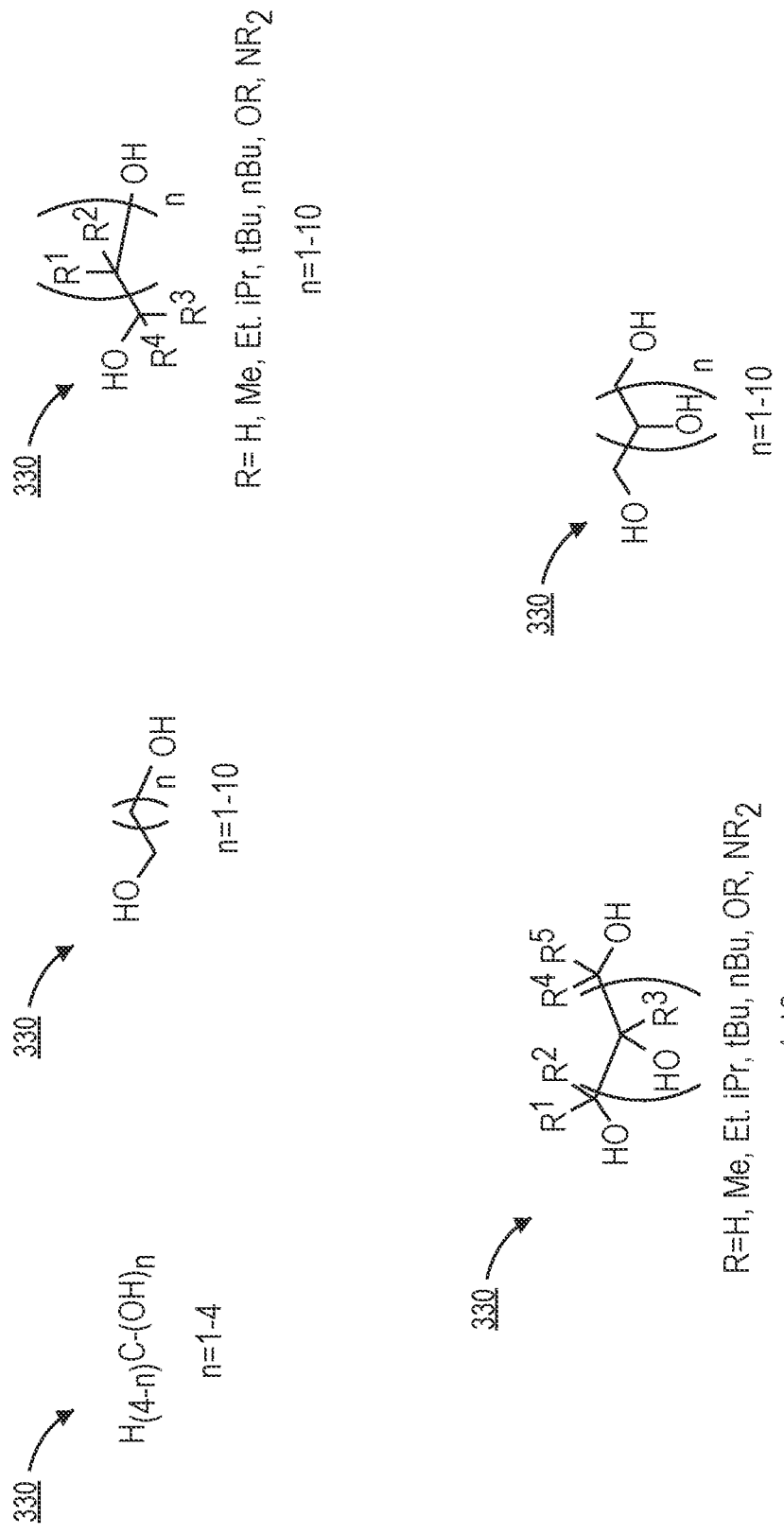
FIG. 3 includes exemplary oxidants that may be used in the process described in the flowchart of FIG. 1, in accordance with an embodiment of the present disclosure.

Several exemplary molecules 330 that may be used as the oxidant vapor are provided in FIG. 3. In FIG. 3, each of the molecules 330 comprise an —OH group as the reactive ends of the carbon backbone. However, it is to be appreciated that the —OH groups may be replaced with one or more of a diol (two —OH groups), an —$NH_2$ group, an —$NR_2$ group, an —OR group, an —RCOO group, a carboxylic acid, an isocyanate, or an isothiocyanate. In a particular embodiment, the oxidant vapor may comprise ethylene glycol.

Additionally, all R groups within a single molecule may be the same, or different R groups may be included within a single molecule. It is to be appreciated that modifications to the R groups and modifications to the length of the carbon backbone may contribute to the photoresist film properties, such as sensitivity to exposure and etch selectivity during the develop process. Accordingly, optimizations to the resulting metal oxo photoresist may be provided by modifying the R groups and/or the length of the carbon backbone. For example, modifying the length of the carbon backbone may allow for the carbon percentage in the resulting photoresist to be tuned.

Embodiments may also include providing one or more oxygen containing gasses into the chamber along with the oxidant vapor molecules 330. For example $H_2O$, $H_2O_2$, $O_2$, CO, $CO_2$, $N_2O$, NO, RCOOH, or acrylic acid ($CH_2$=CH—COOH) may also be provided into the chamber along with oxidant vapor molecules 330. In an embodiment, the oxidant vapor may be diluted by a carrier gas. The carrier gas may be an inert gas such as, Ar, $N_2$, or He.

In an embodiment, process 120 may continue with optional operation 123 which comprises treating the metal oxo photoresist layer with a plasma. In an embodiment, the plasma treatment may include a plasma generated from one or more inert gasses, such as Ar, $N_2$, He, etc. In an embodiment, the inert gas or gasses may also be mixed with one or more oxygen containing gasses, such as $O_2$, $CO_2$, CO, NO, $NO_2$, $H_2O$, etc. In an embodiment, the vacuum chamber may be purged prior to operation 123. The purge may comprise a pulse of an inert gas such as Ar, $N_2$, He, etc.

In one embodiment, process 120 may be executed with operation 121 and 122 being implemented at the same time. That is, providing a metal precursor vapor to the vacuum chamber and providing an oxidant vapor to the vacuum chamber may be done at the same time. After a metal oxo photoresist film with a desired thickness is formed, process 120 may be halted. In an embodiment, the optional plasma treatment operation 123 may be executed after a metal oxo photoresist film with a desired thickness is formed.

In other embodiments, process 120 may be executed in a pulsed manner. That is, a pulse of metal precursor vapor may be provided to the vacuum chamber followed by a pulse of the oxidant vapor. In an embodiment, a cycle comprising a pulse of the metal precursor vapor and a pulse of the oxidant vapor may be repeated a plurality of times to provide a metal oxo photoresist film with a desired thickness. In an embodiment, the order of the cycle may be switched. For example, the oxidant vapor may be pulsed first and the metal precursor vapor may be pulsed second.

In an embodiment, a pulse duration of the metal precursor vapor may be substantially similar to a pulse duration of the oxidant vapor. In other embodiments, the pulse duration of the metal precursor vapor may be different than the pulse duration of the oxidant vapor. In an embodiment, the pulse durations may be between 0 seconds and 1 minute. In a particular embodiment, the pulse durations may be between 1 second and 5 seconds.

In an embodiment, each iteration of the cycle uses the same processing gasses. In other embodiments, the processing gasses may be changed between cycles. For example, a first cycle may utilize a first metal precursor vapor, and a second cycle may utilize a second metal precursor vapor. Subsequent cycles may continue alternating between the first metal precursor vapor and the second metal precursor vapor. In an embodiment, multiple oxidant vapors may be alternated between cycles in a similar fashion.

In an embodiment, the optional plasma treatment of operation 123 may be executed after every cycle. That is, each cycle may comprise a pulse of metal precursor vapor, a pulse of oxidant vapor, and a plasma treatment. In an alternate embodiment, the optional plasma treatment of operation 123 may be executed after a plurality of cycles. In yet another embodiment, the optional plasma treatment operation 123 may be executed after the completion of all cycles (i.e., as a post treatment).

In an embodiment, process 120 may be a thermal process or a plasma process. In the case of a thermal process, the reaction between the metal precursor vapor and the oxidant vapor may be driven thermally. Such an embodiment may be referred to as a CVD process. In the case of a plasma process, a plasma may be struck during one or both of operations 121 and 122. In such instances, the presence of the plasma may enhance the chemical reaction used to form the metal oxo photoresist. Such an embodiment may be referred to as a PE-CVD process. In an embodiment, any plasma source may be used to form the plasma. For example, the plasma source may include, but is not limited to, a capacitively coupled plasma (CCP) source, an inductively coupled plasma (ICP) source, a remote plasma source, or a microwave plasma source.

In an embodiment, the vacuum chamber utilized in process 120 may be any suitable chamber capable of providing a sub-atmospheric pressure. In an embodiment, the vacuum chamber may include temperature control features for controlling chamber wall temperatures and/or for controlling a temperature of the substrate. In an embodiment, the vacuum chamber may also include features for providing a plasma within the chamber. A more detailed description of a suitable vacuum chamber is provided below with respect to FIG. 5.

In an embodiment, the substrate may be temperature controlled during process 120. For example, the temperature of the substrate may be between approximately 0° C. and approximately 500° C. In a particular embodiment, the substrate may be held to a temperature between room temperature and 150° C.

Figure 4:
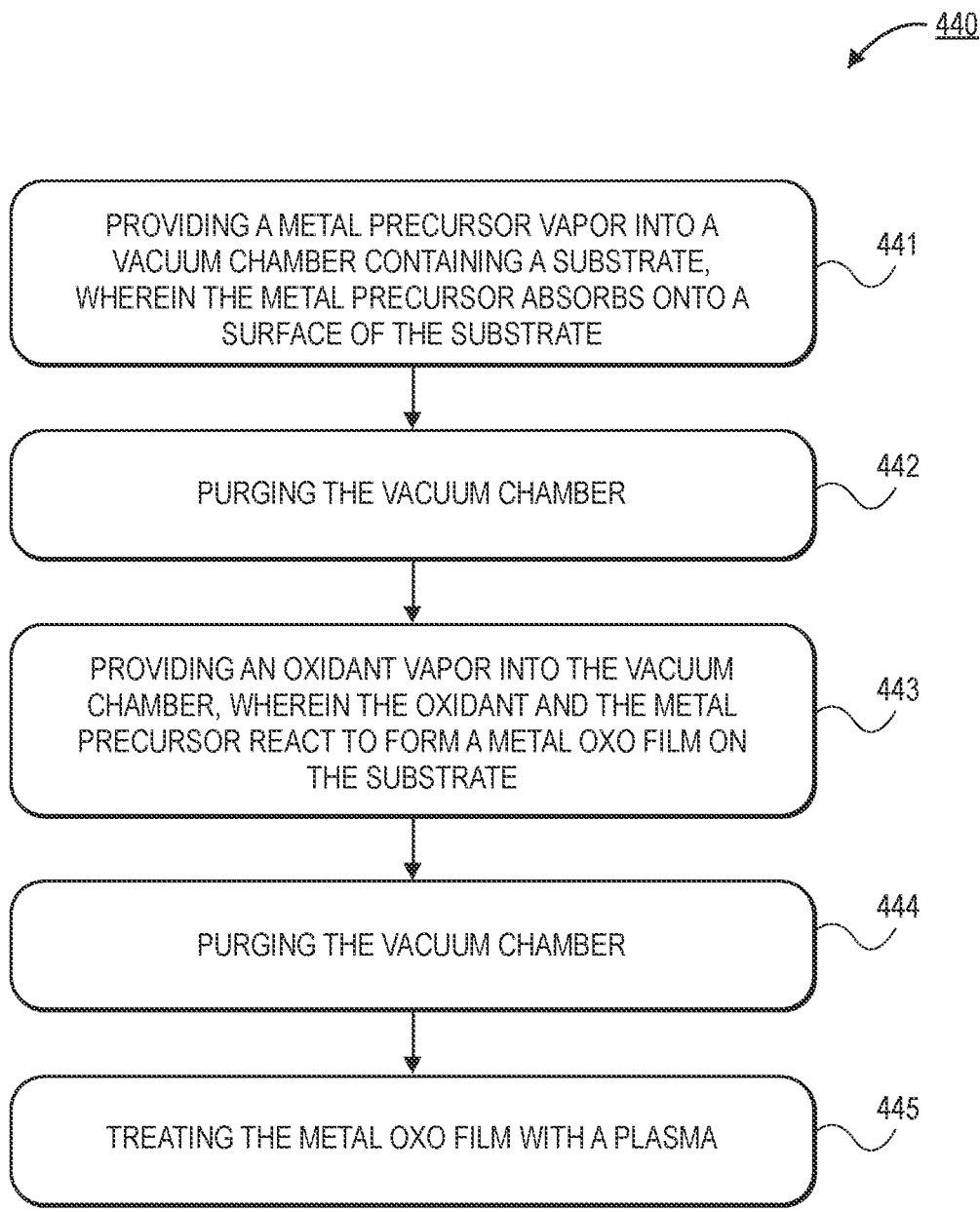
FIG. 4 is a flowchart illustrating a process for forming a photoresist on a substrate using a vacuum deposition process, in accordance with an additional embodiment of the present disclosure.

Referring now to FIG. 4, a flowchart illustrating a process 440 for depositing a metal oxo photoresist on a substrate surface is provided, in accordance with an additional embodiment of the present disclosure. The process 440 may be described as an ALD or a PE-ALD process. In an ALD process, the chemical reactions are driven thermally, whereas in a PE-ALD process the chemical reactions may be enhanced by the presence of a plasma. In PE-ALD processes a hydrocarbon may also be flown into the chamber during plasma assisted deposition to incorporate more carbon into the film. When the plasma is on during the deposition, and if there are hydrocarbon molecules in the chamber, it may add more carbon to the film. A form of carbon could be M-C (M=metal). M-C (e.g., Sn—C) can be sensitive to exposure. A hydrocarbon can be a carbon containing molecule, such as, for example, $CH_2$=$CH_2$, acetylene, $CH_4$, propylene, etc.

In an embodiment, process 440 may begin with operation 441 which comprises providing a metal precursor vapor into a vacuum chamber containing a substrate. In an embodiment, the metal precursor vapor may comprise a molecule with one or more metal atoms. The metal precursor vapor in operation 441 may be similar to the metal precursor vapors described above with respect to operation 121 in process 120. For example, the one or more metal atoms of the metal precursor vapor may comprise one or more of Sn, Hf, Zr, Co, Cr, Mn, Fe, Cu, Ni, Mo, W, Ta, Os, Re, Pd, Pt, Ti, V, In, Sb, Al, As, Ge, Se, Cd, Ag, Pb, Au, Er, Yb, Pr, La, Na, and Mg. In a particular embodiment, the metal precursor vapor may comprise TDMASn. In an embodiment, ligands of the metal precursor vapor may comprise one or more of alkyl, alkenyl, alkynyl, aryl, benzyl, $NR_2$, halide, Cp (cyclopentadienyl), alkoxy, imide, phosphene, phosphite, isocyanate, isothiocyanate, cyanate, thiocyanate, borane, and borane amine ligands. In some embodiments, one ligand may have more than one donor atom, and the donor atoms can be different from each other (e.g., ligands with O and N donor atoms). Examples of ligands with more than one donor atom may include, but are not limited to, carboxylate, acetonate, amidate, amidinate, pyrazolate, carbohydrazide. In an embodiment, the metal precursor vapor may be diluted by a carrier gas. The carrier gas may be an inert gas such as, Ar, $N_2$, or He.

Additionally, it is to be appreciated that more than one metal precursor vapor may be provided into the vacuum chamber. For example, a first metal precursor may comprise Sn and a second metal precursor may comprise Hf. In such embodiments, the resulting metal oxo photoresist may comprise two or more different types of metal atoms.

In an embodiment, the metal precursor vapor absorbs to the surface of the substrate. In an embodiment, a monolayer of the metal precursor may be provided substantially over a surface of the substrate. However, in other embodiments several layers of the metal precursor vapor may absorb to the surface of the substrate.

In an embodiment, process 440 may continue with operation 442 which comprises purging the vacuum chamber. In an embodiment, the purging process removes residual metal precursor vapor and any byproducts from the vacuum chamber. The purging process may include a pulse of an inert gas such as, Ar, $N_2$, He, etc.

In an embodiment, process 440 may continue with operation 443 which comprises providing an oxidant vapor into the vacuum chamber. The oxidant vapor reacts with the surface absorbed metal precursor to form a metal oxo photoresist layer over the surface of the substrate. Since the metal precursor is absorbed to the surface of the substrate, the reaction may be considered self-limiting. In an embodiment, the oxidant vapor may comprise a carbon backbone with reactive groups on opposing ends of the carbon backbone. The reactive groups initiate the reaction with the metal precursor that results in the formation of a metal oxo photoresist on the substrate.

In an embodiment, the oxidant vapor of operation 443 may be similar to the oxidant vapor described with respect to operation 122 in process 120. For example, FIG. 3 provides exemplary molecules 330 that may be used as the oxidant vapor. Additionally, the —OH groups at the ends of the carbon backbone may be replaced with one or more of a diol (two —OH groups), an —$NH_2$ group, an —$NR_2$ group, an —OR group, an —RCOO group, a carboxylic acid, an isocyanate, or an isothiocyanate. In a particular embodiment, the oxidant vapor may comprise ethylene glycol.

Additionally, all R groups within a single molecule may be the same, or different R groups may be included within a single molecule. It is to be appreciated that modifications to the R groups and modifications to the length of the carbon backbone may contribute to the photoresist film properties, such as sensitivity to exposure and etch selectivity during the develop process. Accordingly, optimizations to the resulting metal oxo photoresist may be provided by modifying the R groups and/or the length of the carbon backbone.

Embodiments may also include providing one or more oxygen containing gasses into the chamber along with the oxidant vapor molecules 330 in operation 443. For example $H_2O$, $H_2O_2$, $O_2$, CO, $CO_2$, $N_2O$, NO, RCOOH, or acrylic acid ($CH_2$=CH—COOH) may also be provided into the chamber along with oxidant vapor molecules 330. In an embodiment, the oxidant vapor may be diluted by a carrier gas. The carrier gas may be an inert gas such as, Ar, $N_2$, or He.

In an embodiment, a pulse duration of the metal precursor vapor may be substantially similar to a pulse duration of the oxidant vapor. In other embodiments, the pulse duration of the metal precursor vapor may be different than the pulse duration of the oxidant vapor. In an embodiment, the pulse durations may be between 0 seconds and 1 minute. In a particular embodiment, the pulse durations may be between 1 second and 5 seconds.

In an embodiment, process 440 may continue with operation 444 which comprises purging the vacuum chamber. In an embodiment, the purging process removes residual oxidant vapor and any byproducts from the vacuum chamber. The purging process may include a pulse of an inert gas such as, Ar, $N_2$, He, etc.

In an embodiment, process 440 may continue with optional operation 445 which comprises treating the metal oxo photoresist layer with a plasma. In an embodiment, the plasma treatment may include a plasma generated from one or more inert gasses, such as Ar, $N_2$, He, etc. In an embodiment, the inert gas or gasses may also be mixed with one or more oxygen containing gasses, such as $O_2$, $CO_2$, CO, NO, $NO_2$, $H_2O$, etc.

In an embodiment, processing operations 441-444 may define a cycle of the process 440. Embodiments may include repeating the cycle a plurality of times in order to provide a metal oxo photoresist film with a desired thickness. In an embodiment, the optional plasma treatment operation 445 may be executed after each cycle. That is, each cycle may comprise a pulse of metal precursor vapor, a purge, a pulse of oxidant vapor, a purge, and a plasma treatment. In other embodiments, the optional plasma treatment operation 445 may be executed after a plurality of cycles. In an additional embodiment, the optional plasma treatment operation 445 may be executed after the completion of all cycles (i.e., as a post treatment).

In an embodiment, each iteration of the cycle uses the same processing gasses. In other embodiments, the processing gasses may be changed between cycles. For example, a first cycle may utilize a first metal precursor vapor, and a second cycle may utilize a second metal precursor vapor. Subsequent cycles may continue alternating between the first metal precursor vapor and the second metal precursor vapor. In an embodiment, multiple oxidant vapors may be alternated between cycles in a similar fashion.

In an embodiment, process 440 may be a thermal process or a plasma process. In the case of a thermal process, the reaction between the metal precursor vapor and the oxidant vapor may be driven thermally. Such an embodiment may be referred to as an ALD process. In the case of a plasma process, a plasma may be struck during one or both of operations 441 and 443. In such instances, the presence of the plasma may enhance the chemical reaction used to form the metal oxo photoresist. Such an embodiment may be referred to as a PE-ALD process. In an embodiment, any plasma source may be used to form the plasma. For example, the plasma source may include, but is not limited to, a CCP source, an ICP source, a remote plasma source, or a microwave plasma source.

In an embodiment, the vacuum chamber utilized in process 440 may be any suitable chamber capable of providing a sub-atmospheric pressure. In an embodiment, the vacuum chamber may include temperature control features for controlling chamber wall temperatures and/or for controlling a temperature of the substrate. In an embodiment, the vacuum chamber may also include features for providing a plasma within the chamber. A more detailed description of a suitable vacuum chamber is provided below with respect to FIG. 5.

In an embodiment, the substrate may be temperature controlled during process 440. For example, the temperature of the substrate may be between approximately 0° C. and approximately 500° C. In a particular embodiment, the substrate may be held to a temperature between room temperature and 150° C.

Providing metal oxo photoresist films using vapor phase processes such as described in the embodiments above provides significant advantages over wet chemistry methods. One such advantage is the elimination of wet byproducts. With a vapor phase process, liquid waste is eliminated and byproduct removal is simplified. Additionally, vapor phase processes provide a more uniform photoresist layer. Uniformity in this sense may refer to thickness uniformity across the wafer and/or uniformity of the distribution of metal components of the metal oxo film. Particularly, CVD, PE-CVD, ALD, and PE-ALD processes have been shown to provide excellent thickness uniformity and constituent uniformity.

Additionally, the use of vapor phase processes provides the ability to fine-tune the percentage of metal in the photoresist and the composition of the metal in the photoresist. The percentage of the metal may be modified by increasing/decreasing the flow rate of the metal precursor into the vacuum chamber and/or by modifying the pulse lengths of the metal precursor/oxidant. The use of a vapor phase process also allows for the inclusion of multiple different metals into the metal oxo film. For example, a single pulse flowing two different metal precursors may be used, or alternating pulses of two different metal precursors may be used.

Furthermore, it has been shown that metal oxo photoresists that are formed using vapor phase processes are more resistant to thickness reduction after exposure. It is believed, without being tied to a particular mechanism, that the resistance to thickness reduction is attributable, at least in part, to the reduction of carbon loss upon exposure.

Figure 5:
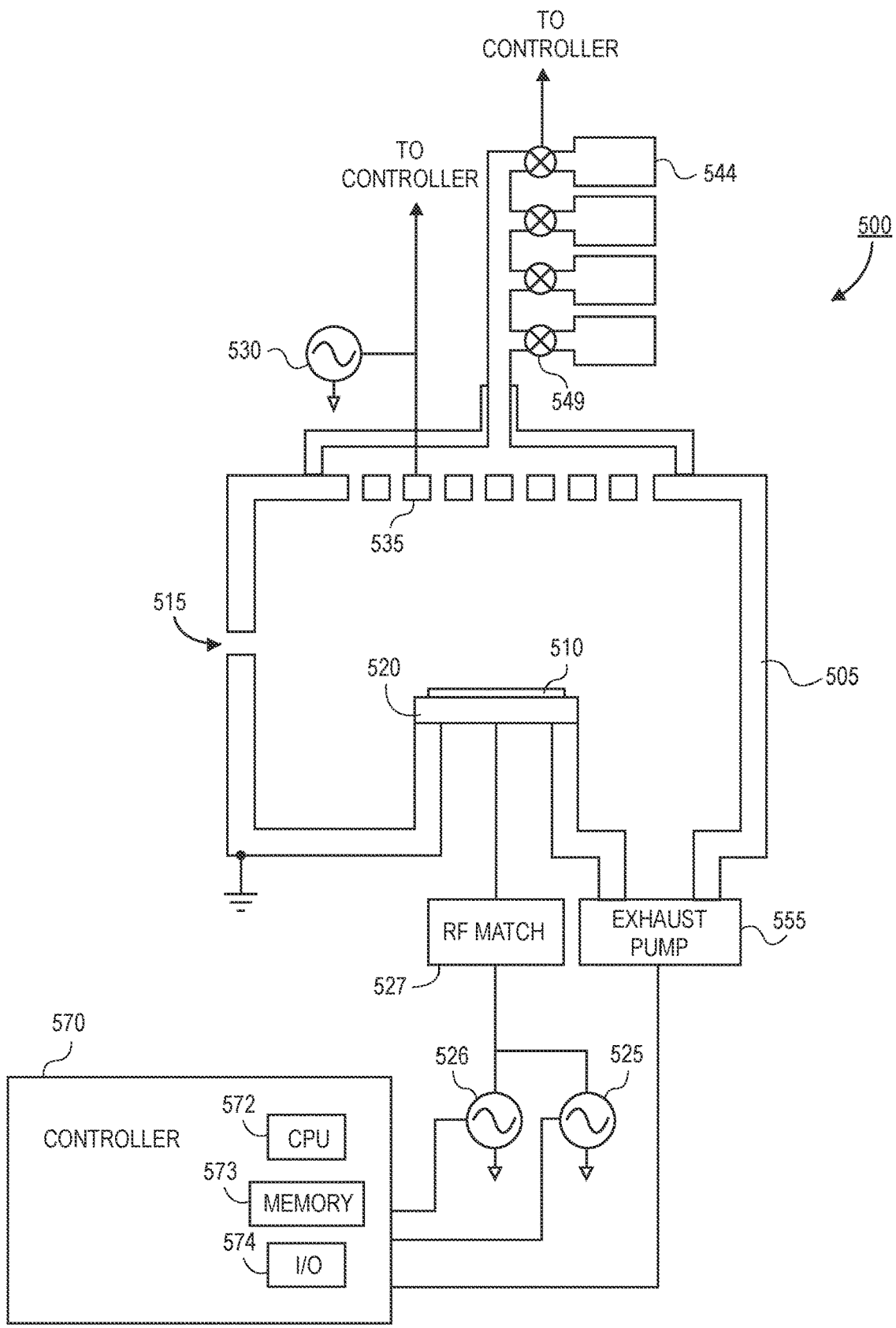
FIG. 5 is a cross-sectional illustration of a processing tool that may be used to implement the process in FIG. 1 or FIG. 4, in accordance with an embodiment of the present disclosure.

FIG. 5 is a schematic of a vacuum chamber configured to perform a vapor phase deposition of a metal oxo photoresist, in accordance with an embodiment of the present disclosure. Vacuum chamber 500 includes a grounded chamber 505. A substrate 510 is loaded through an opening 515 and clamped to a temperature controlled chuck 520.

Process gases, are supplied from gas sources 544 through respective mass flow controllers 549 to the interior of the chamber 505. In certain embodiments, a gas distribution plate 535 provides for distribution of process gases 544, such as a metal precursor, an oxidant, and an inert gas. Chamber 505 is evacuated via an exhaust pump 555.

When RF power is applied during processing of a substrate 510, a plasma is formed in chamber processing region over substrate 510. Bias power RF generator 525 is coupled to the temperature controlled chuck 520. Bias power RF generator 525 provides bias power, if desired, to energize the plasma. Bias power RF generator 525 may have a low frequency between about 2 MHz to 60 MHz for example, and in a particular embodiment, is in the 13.56 MHz band. In certain embodiments, the vacuum chamber 500 includes a third bias power RF generator 526 at a frequency at about the 2 MHz band which is connected to the same RF match 527 as bias power RF generator 525. Source power RF generator 530 is coupled through a match (not depicted) to a plasma generating element (e.g., gas distribution plate 535) to provide a source power to energize the plasma. Source RF generator 530 may have a frequency between 100 and 180 MHz, for example, and in a particular embodiment, is in the 162 MHz band. Because substrate diameters have progressed over time, from 150 mm, 200 mm, 300 mm, etc., it is common in the art to normalize the source and bias power of a plasma etch system to the substrate area.

The vacuum chamber 500 is controlled by controller 570. The controller 570 may comprise a CPU 572, a memory 573, and an I/O interface 574. The CPU 572 may execute processing operations within the vacuum chamber 500 in accordance with instructions stored in the memory 573. For example, one or more processes such as processes 120 and 440 described above may be executed in the vacuum chamber by the controller 570.

Figure 6:
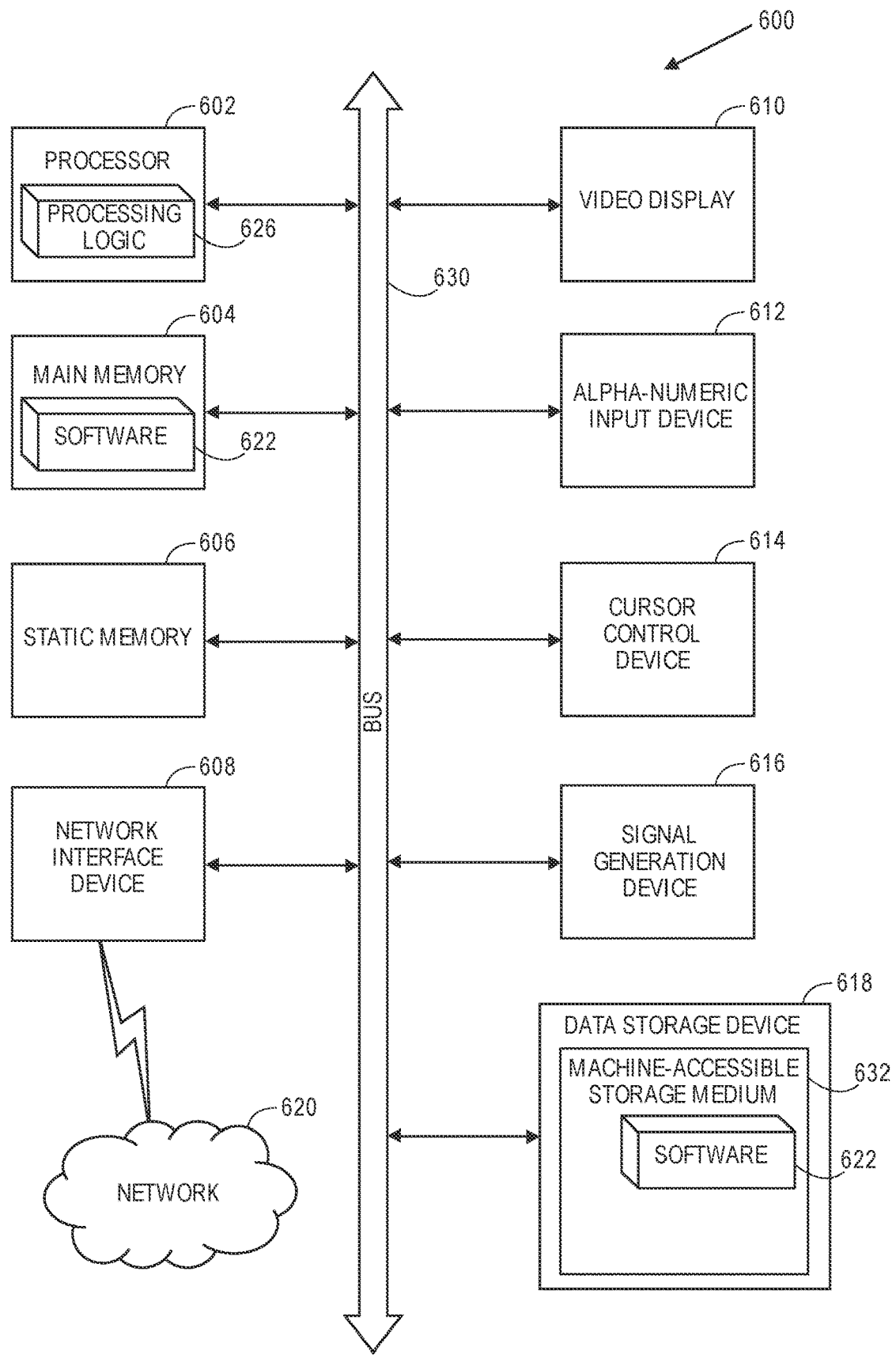
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of depositing a metal oxo photoresist on a substrate. The method includes vaporizing a metal precursor into a vacuum chamber and vaporizing an oxidant into the vacuum chamber. The metal precursor and the oxidant may be sequentially provided into the vacuum chamber or supplied to the vacuum chamber at the same time. The reaction between the metal precursor and the oxidant result in the formation of the metal oxo photoresist on the substrate. The metal oxo photoresist may be treated with a plasma treatment in some embodiments.

Thus, methods for forming a metal oxo photoresist using vapor phase processes have been disclosed.

What is claimed is:

1. A method of forming a photoresist layer over a substrate in a vacuum chamber, comprising:
   providing a first metal precursor vapor into the vacuum chamber;
   providing a first oxidant vapor into the vacuum chamber, wherein a reaction between the first metal precursor vapor and the first oxidant vapor results in the formation of the photoresist layer on a surface of the substrate, wherein the photoresist layer is a metal oxo containing material;
   providing a second metal precursor vapor into the vacuum chamber, wherein the second metal precursor vapor is different than the first metal precursor vapor;
   providing a second oxidant vapor into the vacuum chamber, wherein the second oxidant vapor is different than the first oxidant vapor, and wherein providing the second oxidant vapor or the first oxidant vapor into the vacuum chamber comprises providing the second oxidant vapor or the first oxidant vapor together with an oxygen-containing gas, the oxygen-containing gas different than the corresponding one of the second oxidant vapor or the first oxidant vapor, wherein the oxygen-containing gas comprises acrylic acid, and wherein the corresponding one of the second oxidant vapor or the first oxidant vapor comprises a glycol; and
   alternating between (i) providing the first metal precursor vapor and the first oxidant vapor into the chamber, and (ii) providing the second metal precursor vapor and the second oxidant vapor into the chamber.

2. The method of claim 1, wherein the first metal precursor vapor and the first oxidant vapor are provided to the vacuum chamber at the same time.

3. The method of claim 1, wherein a pulse of the first metal precursor vapor is provided to the vacuum chamber, and a pulse of the first oxidant vapor is provided to the vacuum chamber after the pulse of the first metal precursor vapor.

4. The method of claim 3, further comprising:
   repeating alternating pulses of the first metal precursor vapor and the first oxidant vapor.

5. The method of claim 1, further comprising:
   striking a plasma in the vacuum chamber during one or both of providing the first metal precursor vapor into the vacuum chamber and providing the first oxidant vapor into the vacuum chamber.

6. The method of claim 1, further comprising:
   treating the photoresist layer with a plasma.

7. The method of claim 6, further comprising:
   flowing a hydrocarbon to the chamber during plasma assisted deposition.

8. The method of claim 1, wherein the first metal precursor vapor comprises one or more of Sn, Hf, Zr, Co, Cr, Mn, Fe, Cu, Ni, Mo, W, Ta, Os, Re, Pd, Pt, Ti, V, In, Sb, Al, As, Ge, Se, Cd, Ag, Pb, Au, Er, Yb, Pr, La, Na, and Mg.

9. A method of forming a photoresist layer stack over a substrate in a vacuum chamber, comprising:
   initiating a deposition cycle, wherein the deposition cycle comprises:
   providing a first metal precursor vapor into the vacuum chamber, wherein the first metal precursor vapor absorbs to a surface over the substrate;
   purging the vacuum chamber;
   providing a first oxidant vapor into the vacuum chamber, wherein a reaction between the first metal precursor absorbed to the surface over the substrate and the first oxidant vapor results in the formation of a first photoresist layer over the surface of the substrate, wherein the first photoresist layer is a metal oxo containing material;
   purging the vacuum chamber;
   providing a second metal precursor vapor into the vacuum chamber, wherein the second metal precursor vapor is different than the first metal precursor vapor;
   purging the vacuum chamber;
   providing a second oxidant vapor into the vacuum chamber, wherein the second oxidant vapor is different than the first oxidant vapor, wherein a reaction between the second metal precursor and the second oxidant vapor results in the formation of a second photoresist layer over the surface of the first photoresist layer, wherein the second photoresist layer is a metal oxo containing material, and wherein providing the second oxidant vapor or the first oxidant vapor into the vacuum chamber comprises providing the second oxidant vapor or the first oxidant vapor together with an oxygen-containing gas, the oxygen-containing gas different than the corresponding one of the second oxidant vapor or the first oxidant vapor, wherein the oxygen-containing gas comprises acrylic acid, and wherein the corresponding one of the second oxidant vapor or the first oxidant vapor comprises a glycol.

10. The method of claim 9, further comprising:
repeating the deposition cycle a plurality of times.

11. The method of claim 10, wherein the deposition cycle further comprises:
treating the first photoresist layer and/or the second photoresist layer with a plasma.

12. The method of claim 10, further comprising:
treating the photoresist layer stack with a plasma after repeating the deposition cycle the plurality of times.

13. The method of claim 9, further comprising:
striking a plasma in the vacuum chamber during the deposition cycle.

14. The method of claim 9, wherein the first metal precursor vapor comprises one or more of Sn, Hf, Zr, Co, Cr, Mn, Fe, Cu, Ni, Mo, W, Ta, Os, Re, Pd, Pt, Ti, V, In, Sb, Al, As, Ge, Se, Cd, Ag, Pb, Au, Er, Yb, Pr, La, Na, and Mg.

* * * * *